United States Patent
Mukherjee et al.

(10) Patent No.: US 11,515,209 B2
(45) Date of Patent: Nov. 29, 2022

(54) METHODS AND APPARATUS FOR SCRIBE SEAL STRUCTURES

(71) Applicant: TEXAS INSTRUMENTS INCORPORATED, Dallas, TX (US)

(72) Inventors: Subhashish Mukherjee, Bangalore (IN); Raja Selvaraj, Bangalore (IN); Venugopal Gopinathan, Cambridge, MA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/773,692

(22) Filed: Jan. 27, 2020

(65) Prior Publication Data

US 2020/0161184 A1    May 21, 2020

Related U.S. Application Data

(63) Continuation of application No. 15/343,557, filed on Nov. 4, 2016, now Pat. No. 10,546,780.

(30) Foreign Application Priority Data

Sep. 7, 2016  (IN) .............................. 201641030533

(51) Int. Cl.
*H01L 21/78* (2006.01)
*H01L 23/58* (2006.01)
(Continued)

(52) U.S. Cl.
CPC .............. *H01L 21/78* (2013.01); *H01L 23/18* (2013.01); *H01L 23/585* (2013.01); *H01L 23/66* (2013.01);
(Continued)

(58) Field of Classification Search
CPC ....... H01L 21/78; H01L 23/18; H01L 23/562; H01L 23/585; H01L 23/66;
(Continued)

(56) References Cited

U.S. PATENT DOCUMENTS 6,911,348 B1 *  6/2005  Becker .................... H01L 28/10
                                                       438/10
7,898,056 B1 *  3/2011  Keramat ............... H01L 23/564
                                                       257/503

(Continued)

*Primary Examiner* — Peter Bradford
(74) *Attorney, Agent, or Firm* — Ray A. King; Charles A. Brill; Frank D. Cimino

(57) ABSTRACT

An example integrated circuit die includes: lower level conductor layers, lower level insulator layers between the lower level conductor layers, lower level vias extending vertically through the lower level insulator layers, upper level conductor layers overlying the lower level conductor layers, upper level insulator layers between and surrounding the upper level conductor layers, upper level vias; at least two scribe seals arranged to form a vertical barrier extending vertically from the semiconductor substrate to a passivation layer at an upper surface of the integrated circuit die; and at least one opening extending vertically through one of the at least two scribe seals and extending through: the upper level conductor layers, the upper level via layers, the lower level conductor layers, and the lower level via layers.

6 Claims, 8 Drawing Sheets

(51) Int. Cl.
*H01L 23/66* (2006.01)
*H01L 23/18* (2006.01)
*H01L 29/06* (2006.01)
*H01L 21/768* (2006.01)
*H01L 23/522* (2006.01)
*H01L 23/528* (2006.01)
*H01L 23/00* (2006.01)
*H01L 49/02* (2006.01)

(52) U.S. Cl.
CPC .... *H01L 29/0619* (2013.01); *H01L 21/76805* (2013.01); *H01L 23/528* (2013.01); *H01L 23/5226* (2013.01); *H01L 23/562* (2013.01); *H01L 28/10* (2013.01); *H01L 2223/6677* (2013.01); *H01L 2924/1032* (2013.01); *H01L 2924/10253* (2013.01); *H01L 2924/10271* (2013.01); *H01L 2924/10329* (2013.01); *H01L 2924/14* (2013.01); *H01L 2924/143* (2013.01); *H01L 2924/1432* (2013.01); *H01L 2924/1434* (2013.01); *H01L 2924/1436* (2013.01); *H01L 2924/1437* (2013.01); *H01L 2924/3512* (2013.01)

(58) Field of Classification Search
CPC ........... H01L 29/0619; H01L 21/76805; H01L 23/5226; H01L 23/528; H01L 28/10; H01L 2223/6677; H01L 2924/10253; H01L 2924/10271; H01L 2924/1032; H01L 2924/10329; H01L 2924/14; H01L 2924/143; H01L 2924/1432; H01L 2924/1434; H01L 2924/1436; H01L 2924/1437; H01L 2924/3512
See application file for complete search history.

(56) References Cited

U.S. PATENT DOCUMENTS

| | | | |
|---|---|---|---|
| 2002/0167071 A1* | 11/2002 | Wang | H01L 23/585 257/620 |
| 2005/0218477 A1* | 10/2005 | Takewaki | H01L 23/5258 257/E23.15 |
| 2008/0061397 A1 | 3/2008 | Uchida | |
| 2008/0251923 A1 | 10/2008 | Wang et al. | |
| 2009/0140391 A1 | 6/2009 | Hou et al. | |
| 2009/0294929 A1 | 12/2009 | Lee et al. | |
| 2009/0321734 A1 | 12/2009 | Ogawa et al. | |
| 2009/0322446 A1* | 12/2009 | Daley | H01L 23/5222 257/E21.022 |
| 2010/0010242 A1 | 4/2010 | Chang et al. | |
| 2010/0078769 A1 | 4/2010 | West et al. | |
| 2010/0084751 A1 | 4/2010 | Frederick, Jr. et al. | |
| 2010/0148314 A1 | 6/2010 | Han | |
| 2012/0044737 A1 | 2/2012 | Chung | |
| 2013/0027073 A1* | 1/2013 | Pagani | G01R 31/2834 324/756.03 |
| 2013/0270710 A1 | 10/2013 | Chen et al. | |
| 2014/0062214 A1* | 3/2014 | Seo | H04B 5/0037 343/866 |
| 2016/0020320 A1 | 1/2016 | Ikimura | |
| 2016/0093628 A1 | 3/2016 | Chen et al. | |
| 2016/0211187 A1* | 7/2016 | Zhang | H01L 23/58 |
| 2016/0254258 A1 | 9/2016 | Tsuchiko | |

* cited by examiner

METHODS AND APPARATUS FOR SCRIBE SEAL STRUCTURES

CROSS-REFERENCE TO RELATED APPLICATIONS

This application is a continuation of U.S. patent application Ser. No. 15/343,557 filed Nov. 4, 2016, which claims priority to India Patent Application No. 201641030533 filed Sep. 7, 2016, the entireties of all of which are incorporated herein by reference.

BACKGROUND

This relates generally to the use of scribe seals in semiconductor device and integrated circuit manufacture, and more particularly to scribe seals to enhance die-to-die RF coupling and die-to-die coupling using magnetic and capacitive coupling.

Integrated circuits form as dies on a semiconductor wafer. Various process steps are performed on the semiconductor wafer, including: forming active areas within the semiconductor material by use of impurity doping and ion implantation; deposition and patterning of insulator layers; and forming conductor layers such as metallic layers. The insulator layers are formed over the semiconductor substrate, and between and surrounding the conductor layers, to provide electrical insulation between layers of conductors. The conductor layers include materials such as doped polysilicon, aluminum, gold and copper conductor layers. Another insulator layer is formed over the entire device and is referred to as the "passivation layer" or sometimes referred to as a "protective overcoat" or "PO" layer. The passivation layer provides electrical insulation as well as protection from moisture and other impurities that can corrode or adversely affect the conductors and the semiconductor substrate. The insulator layers are thin, brittle layers of dielectric materials that can be sometimes be considered ceramic materials, such as silicon dioxide, silicon nitride, silicon oxynitride, silicon carbide, and polyimide. A bond pad layer, typically of aluminum or another conductor, can be formed at the top of the uppermost insulator layer, and covered by the PO layer. The bond pads are then exposed by opening portions of the PO layer. Bond wires can be mechanically and electrically coupled to the bond pads to form terminals for the packaged integrated circuit when the integrated circuit die is completed as an integrated circuit. Solder balls, solder columns, solder bumps or other connectors can be used instead of bond wires or with bond wires to provide electrical terminals. Packaging material such as a mold compound can be applied to the individual dies or in a "wafer scale" process, prior to forming individual dies; the final package protects the integrated circuit die and the bond wires or solder balls from moisture and mechanical stress.

After the integrated circuits are completely manufactured but while the integrated circuits still reside on a single semiconductor wafer, the devices are separated one from another. This operation is referred to as "singulation" or "dicing" of the semiconductor wafer. Singulation of integrated circuit devices from a semiconductor wafer includes physically separating the devices by a sawing or scribing operation. Mechanical sawing or laser sawing cuts through the semiconductor wafer. The cuts are made in kerf lanes or scribe street areas that are defined between the integrated circuit dies. Sometimes singulation includes laser scribing followed by a mechanical breaking operation along a scribed area.

When the semiconductor wafer is sawed, chipping of the semiconductor wafer can occur. In a mechanical dicing operation, a rotating saw blade has to cut through the insulating layers, the conductor layers, and through the semiconductor wafer. The saw blade has significant vibration and heat is generated while the saw blade is rotating and cutting through these mechanically brittle layers. Use of thick metal layers to form bond or probe pads in the saw kerf lane has resulted in increased chipping and unwanted cracking in the semiconductor wafer during sawing. Cracked wafers result in a loss of finished integrated circuit devices, lowering yield and increasing per unit costs.

Scribe seals are used in order to protect the sensitive metal conductors and doped diffusion areas within the integrated circuit dies during singulation and to protect the completed integrated circuit die afterwards. A scribe seal is a structure usually formed at the periphery of the integrated circuit die and extending from the uppermost layer of conductor material through the insulating layers and to the surface of the semiconductor device. The scribe seal can include: conductor material from each layer of conductor metal; the conductive vias between layers; and the contact material to the semiconductor substrate to form a vertical structure that extends from the passivation layer to the semiconductor substrate and forms a metal seal from the passivation layer extending through the insulation layers to the semiconductor substrate.

Scribe seals form a barrier to ions and process contaminants that might otherwise migrate into the sensitive structures within the integrated circuit die, and form a barrier to moisture and contaminants that might otherwise affect the finished integrated circuit die. Scribe seal structures can include multiple scribe seals formed at the periphery of the integrated circuit die. The scribe seals can be formed in plural concentric scribe seals spaced a distance apart to further increase the effectiveness of the barrier to ion migration and moisture.

SUMMARY

In a described example, an integrated circuit die includes: lower level conductor layers overlying a semiconductor substrate, lower level insulator layers between the lower level conductor layers and surrounding the lower level conductor layers, lower level vias extending vertically through the lower level insulator layers and electrically coupling ones of the lower level conductors, upper level conductor layers overlying the lower level conductor layers, upper level insulator layers between and surrounding the upper level conductor layers, upper level vias extending vertically through the upper level insulator layers and coupling the upper level conductor layers; at least two scribe seals positioned at a periphery of the integrated circuit die and spaced from one another, the at least two scribe seals including the upper level conductor layers, the upper level vias, the lower level conductor layers and the lower level vias to form a vertical barrier extending vertically from the semiconductor substrate to a passivation layer at an upper surface of the integrated circuit die; and at least one opening extending vertically through the respective one of the at least two scribe seals and extending through: the upper level conductor layers, the upper level via layers, the lower level conductor layers, and the lower level via layers.

DETAILED DESCRIPTION OF EXAMPLE EMBODIMENTS

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

The term "scribe street" includes similar terms such as "scribe lane" and "scribe line" and refers to areas on a semiconductor wafer between adjacent integrated circuit dies that are set aside for physically separating the integrated circuit dies. In a mechanical sawing operation, a saw kerf lane is positioned centrally in the scribe street. The laser or saw blade traverses the saw kerf lane during singulation. The material in the saw kerf lane is destroyed during the mechanical sawing operation and is then lost.

Communication between isolated circuits is increasingly needed. A ground voltage difference between isolated circuits can exceed 1000 Volts. To provide isolated communication, opto-coupling has been used. However recent approaches eliminate the need for opto-coupling and the associated optical transmitters and receivers. In one approach, capacitive coupling is used. In another approach, inductive coupling is used.

Recent die-to-die communication techniques include magnetic coupling using coils formed in the integrated circuit dies. The coils transmit and receive signals using electromagnetic radiation. In a multi-chip module package, physical spacing between the dies forms the necessary isolation. Materials such as mold compound formed between the dies may also form part of the isolation. By modulating signals transmitted between devices, die-to-die communication can be achieved without the need for signal traces, pins, and bond wires between the devices, and isolation can be maintained. In other applications, coils on integrated circuits are used for devices where electrical isolation between devices is needed. These applications include power circuitry, transformers, oscillators, and magnetic or inductive interfaces between independent voltage regimes on an integrated circuit, where large differences in voltages can exist. Coils can be used to transfer power or signals from one device to another while also galvanically isolating the integrated circuit devices from one another.

A coil formed on an integrated circuit may be part of an inductor-capacitor tank ("LC" tank") for a voltage controlled oscillator on an integrated circuit, current flowing in the coil can induce eddy current in a scribe seal. Use of the scribe seals has been found to interfere substantially with die-to-die coupling and to reduce efficiency in magnetic and inductive coupling. The interference occurs due to unwanted induced current or eddy currents flowing in the scribe seals.

Figure 1:
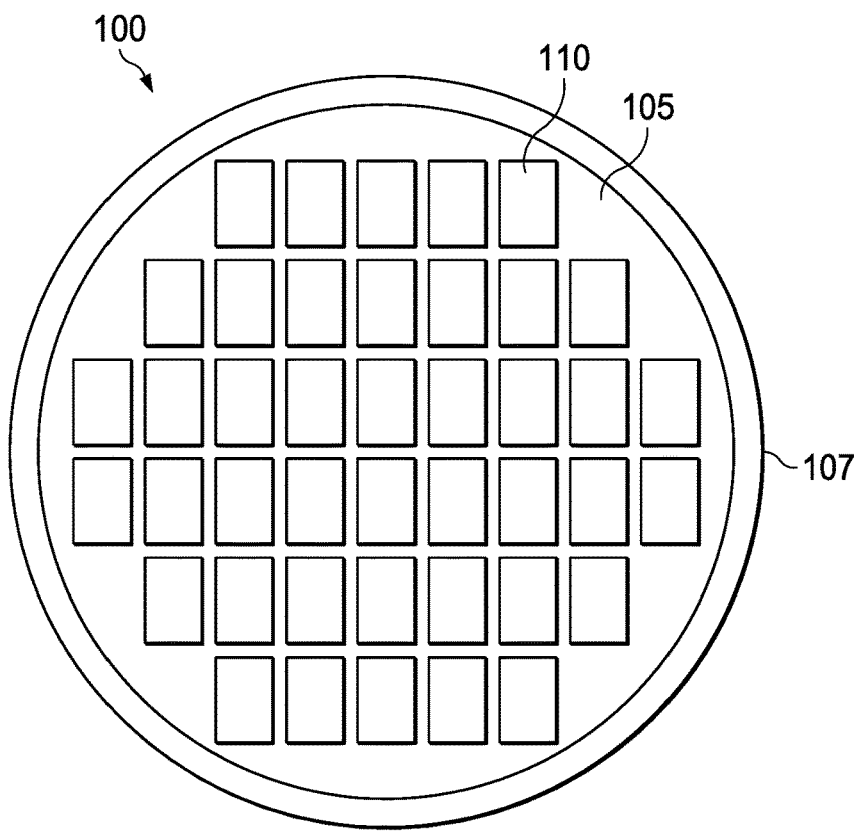
FIG. 1 illustrates a semiconductor wafer and integrated circuit dies.

FIG. 1 depicts in a plan view 100 integrated circuit dies 110 formed on the semiconductor wafer 105. The semiconductor wafer 105 is shown arranged on a wafer support or frame 107. Not visible in this view is a supporting backing material referred to as "dicing tape" which lies beneath and is adhered to the semiconductor wafer 105. During a dicing or singulation operation, the dicing tape supports and stabilizes the integrated circuit dies 110. As the semiconductor wafer is cut or sawed through, the integrated circuit dies remain in position, are physically supported by the wafer dicing tape, and do not fall away from the support 107. Pick and place or other die handling equipment can then be used to remove the integrated circuit dies from the wafer dicing tape after the integrated circuit dies have been sawed apart. The integrated circuit dies 110 are then processed further and eventually are packaged to form completed integrated circuit devices.

Each of the integrated circuit dies 110 can include active devices (not shown) such as transistors, diodes and similar devices formed on the semiconductor substrate 105. The active devices are formed in active areas of the semiconductor wafer. Active areas are areas formed using ion implantation and impurity doping techniques to become p type and n type doped areas. These p type and n type doped areas can be used to form transistors, such as: bipolar transistors; metal oxide semiconductor (MOS) field effect transistors (MOSFETs); diodes; silicon controlled rectifiers; and other devices that conduct current in response to a voltage or current. Passive devices can be formed on the semiconductor wafer, including: capacitors; resistors; and inductors. The passive devices can be formed either using the substrate material or in layers formed over the substrate. Sensors such as fluxgate sensors, current sensors, photosensors, temperature sensors and other sensors can be formed using the active areas and the layers formed over the substrate. In an example, a fluxgate sensor is formed on the integrated circuit dies. A fluxgate sensor includes a magnetic core material including iron wrapped in a conductive coil. Coils and inductors can be formed on the integrated circuit die, including antennas.

When completed, the integrated circuit dies 110 each form a complete circuit that performs a desired function. The integrated circuit dies 110 can form functional circuits such as: transistors; digital circuits such as logic gates; analog circuits such as rectifiers; controllers such as microcontrollers; processors such as digital signal processors or central processing units (CPUs); non-volatile storage devices such as FLASH devices; memory devices such as static random access memory (SRAM) devices or dynamic random access memory (DRAM) devices; integrated sensor devices, or other integrated circuit devices. Each of the integrated circuit dies 110 on a semiconductor wafer 105 can be an identical integrated circuit. Integrated circuits can include a few, many thousands, or even millions of devices.

Figure 2:
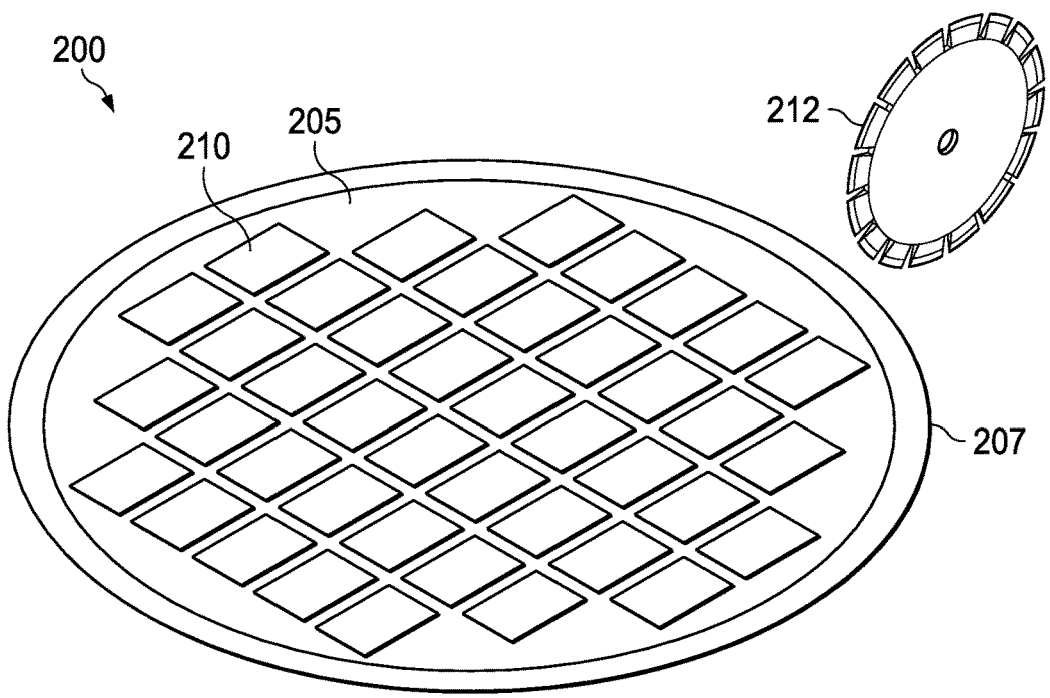
FIG. 2 illustrates a semiconductor wafer and a wafer-dicing saw.

FIG. 2 illustrates in another plan view 200 a semiconductor wafer 205 shown in a mechanical sawing operation. In FIG. 2, similar reference labels are used for those elements that correspond to the elements of FIG. 1, except that the reference labels begin with the digit "2" in FIG. 2, for clarity. In FIG. 2, semiconductor wafer 205 includes a number of integrated circuit dies 210. A support 207 provides mechanical support for the semiconductor wafer 205. A saw blade 212 is shown being applied to the top surface of the semiconductor wafer 205. The saw blade 212 will saw through the semiconductor wafer 205 in defined saw kerf lanes that are positioned in scribe streets between the integrated circuit dies 210. The saw kerf lanes of the scribe streets are areas that will be removed during the sawing operation and so any circuitry positioned there will be destroyed.

Figure 3:
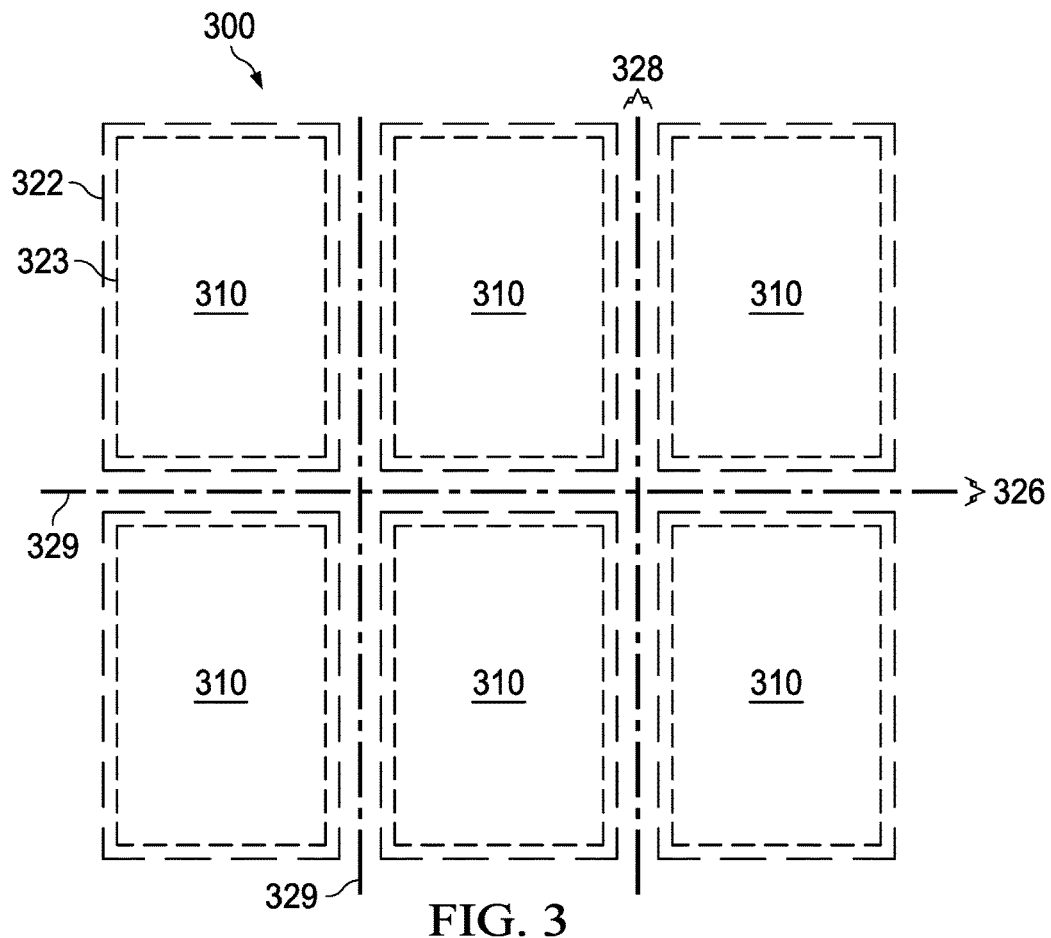
FIG. 3 illustrates in a plan view a portion of a semiconductor wafer and integrated circuit dies with scribe streets and scribe seals.

FIG. 3 depicts in a plan view a portion of a conventional semiconductor wafer 300 having a number of integrated circuit dies 310 formed on it. Areas 326 and 328 are scribe streets including saw kerf lanes 329 for sawing the integrated circuit dies 310 apart in a dicing operation. The scribe streets 326,328 have a width that can vary from about forty microns to over one hundred microns. In an example, the scribe streets are about eighty microns wide. Using less area of the semiconductor wafer for the scribe street areas is desirable, because using a lower area for the scribe street areas leaves more semiconductor wafer area for forming additional integrated circuit dies, lowering the cost per integrated circuit. Kerf lanes 329 in the central portion of the scribe streets 326 and 328 identify the places where the saw will cut through the insulator layers and the conductors overlying the semiconductor wafer. The saw blade can also cut through the semiconductor wafer entirely to physically separate the integrated circuit dies from one another. In an alternative a scribe operation can be followed by a breaking operation, separating the integrated circuit dies along scribed lines.

In FIG. 3, each integrated circuit die 310 is surrounded by at least one conventional scribe seal 322 and may include a second scribe seal 323. The scribe seals 322, 323 include the insulator layers and the conductor layers that are also used in forming the insulators and conductors within the integrated circuit dies 310. The conductor layers of the scribe seal are formed simultaneously with the integrated circuit conductor layers. The insulator layers that lie between and around the conductor layers within the integrated circuit dies 310 are also formed in the scribe seal 322.

Still referring to FIG. 3, the scribe seals are arranged between the scribe streets 326 and the integrated circuit dies 310 and the scribe seals surround the integrated dies 310. The scribe seals are intended to reduce or prevent cracks formed in the insulator layers during dicing in the scribe streets 326, 328 during sawing or scribing from propagating into the integrated circuit dies 310, as well as providing protection to the completed integrated circuit dies as described hereinabove.

The semiconductor wafer 300 can be of any one of several known semiconductor materials including silicon, gallium, gallium arsenide, silicon germanium, and other III-V compounds. These materials can be brittle. The insulator layers can be any of the insulator materials used in semiconductor processing, including: silicon dioxide; silicon nitride; silicon oxynitride; silicon carbide; doped glass such as boron-silicate glass; phosphor silicate glass; undoped silicate glass; fluoro-silicate glass; tetraethyl ortho-silicate oxide (TEOS); and silicon containing hydrogen silsesquioxane. Gels and organics can be used, such as polyimides, organic polymerics, and foams.

Figure 4:
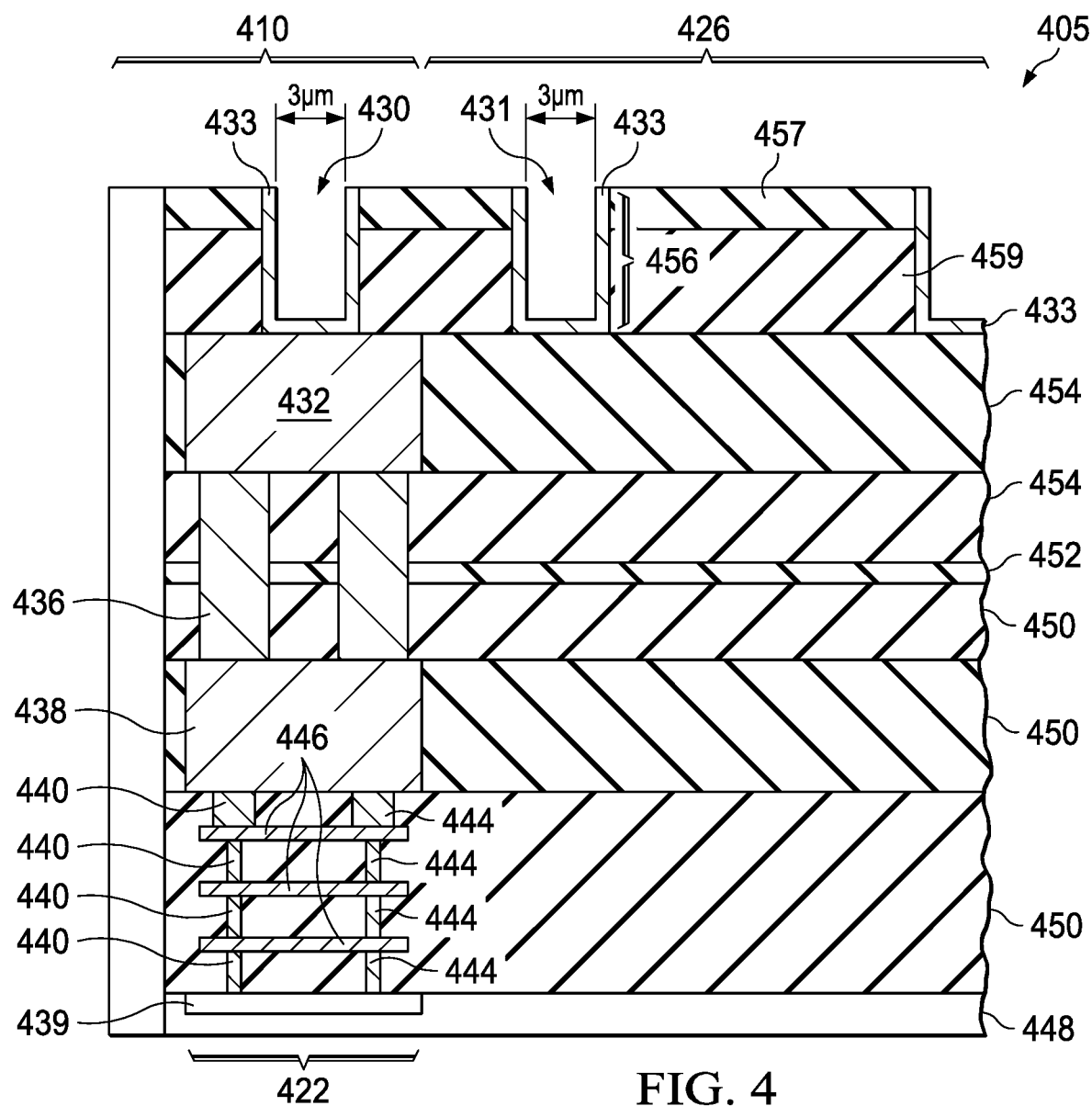
FIG. 4 illustrates in a cross sectional view a portion of a semiconductor wafer.

FIG. 4 depicts in a cross sectional view a portion of a semiconductor wafer 405 including upper level conductor layers and lower level conductor layers such as are used in current semiconductor processes. The scribe seal 422 is a closed loop metal barrier or wall that includes each conductive layer and connects to the semiconductor substrate. In FIG. 4, an example scribe seal 422 is shown. In this scribe seal structure 422, three lower level metal layers 446 are coupled to substrate 448 and to one another by conductive vias 440 and 444 extending through lower level insulator layers. In FIG. 4, two upper level conductor layers 432, 438 are formed in upper level insulator layers 454. These two upper level conductor layers are coupled vertically and electrically to one another by an upper level via layer including vias 435, 436. A passivation layer 456 overlies the structure.

In the structure 422 in FIG. 4, a semiconductor wafer 448 has an active area 439 formed in an upper portion. The active area can be an n-doped or p-doped area such as are used to form transistors.

In FIG. 4, the structure 422 shown is a portion of a scribe seal such as scribe seals 322, 323 shown in the plan view of FIG. 3. In FIG. 4, the scribe seal 422 is shown to illustrate the various insulator layers, conductor layers and vias used in manufacturing the semiconductor wafer.

Scribe seal 422 includes lower level vias 440 formed between the three lower level conductor layers 446. The lower level vias 440 can be formed using tungsten plugs, for example. Other conductive materials used for vias in semiconductor processes can be used. The vias 440 in scribe seal 422 are trench vias. The trench vias form a continuous interruption of the insulator layers on one side of an integrated circuit die. The scribe seal 422 is formed simultaneously with and using the same insulator layers and conductor layers used in the formation of devices within the integrated circuit die 410. In FIG. 4, the lower level conductors 446 can be aluminum. Other metals and alloys can also be used. Contact material that forms the lowest level of the metal in the scribe seal can be aluminum or other material that contacts the semiconductor substrate 448. Aluminum has good adherence to oxides such as silicon oxides that are commonly used for the insulator layers, and has good conductivity/resistance, and is relatively low in cost.

The insulator layers 450 are sometimes referred to by different terms depending on the application and position over the semiconductor substrate. For example, insulator material formed over the active area and prior to any metallization steps can be called "pre-metal dielectric" or "PMD." Insulator layers that are formed surrounding metal layers can be called "inter-level dielectric" or "ILD." Insulator layers that are formed between layers of conductors can be referred to as "inter-metal dielectric" layers or "IMD." Sometimes different materials are used for the different applications. Sometimes the labels indicate the position of the insulator with respect to the vertical structure of conductors and insulator layers. Trench vias 440 are shown vertically stacked over and in contact with the active area 439. For purposes of this application, the term "via" includes both the opening formed in an insulator layer and also the conductive material that fills the opening to form a vertical physical and electrical connection. In the scribe seal 422, trench vias 440 are used in the portion of the scribe seal closest to the integrated circuit die. The trench vias 440 and the conductor layers the trench vias couple together thus form a continuous wall of conductor material that interrupts each of the insulation layers.

In FIG. 4, the lower level conductor layers 446 can be formed of a metal used in semiconductor processes for forming conductors in the "front end of the line" processes. For example, metal layers 446 can be formed of aluminum and aluminum alloys. Aluminum conductors in semiconductor devices can be formed using photolithography, including photoresist deposition, photoresist exposure, photoresist patterning, and etch methods. The trench vias 440 can be formed using conductive via materials typically used in semiconductor processes such as tungsten and its alloys. Other conductive materials can be used.

The insulation layers 450, 452 and 454 are formed using conventional semiconductor processes for dielectrics. These layers can be formed using chemical vapor deposition (CVD), plasma enhanced chemical vapor deposition (PECVD) and can be thermally grown. Tetraethyl orthosilicate (TEOS) can be used. Typically the insulator layers 450, 454, 452 will include oxide layers and nitride layers in different portions, so that selective etching processes can be used. Etch stop layers (ESL) can be formed in addition to and between the layers visible in FIG. 4. Additional films and layers can be included to: assist in etch processing; aid in adhesion; provide barrier layers; provide anti-reflective coatings; and provide backside anti-reflective coatings to improve photolithographic processes. The materials used for the insulator layers can include, without limitation: silicon oxide, silicon nitride, silicon carbide, silicon oxynitride, SiOC, and other films and gel dielectrics. High-k and low-k dielectrics can be included in the insulator layers.

In FIG. 4, the scribe seal 422 also includes upper level layer conductors 432, 438. These can be formed in the "back end of the line" or "BEOL" processes. Copper conductors are used to form upper level metal conductor layers in many semiconductor processes. Copper has a lower resistance than aluminum and may be less prone to electromigration problems. Diffusion barrier materials (not shown for clarity) surround the copper on all sides to prevent copper ion diffusion into surrounding layers or materials. In FIG. 4, the scribe seal 422 includes a first copper conductor 438 and a second copper conductor 432 that is the uppermost upper level layer conductor in this example. In various example semiconductor processes, more or fewer conductor layers can be used, including more or fewer lower level conductor layers and more or fewer upper level conductor layers.

In FIG. 4, the copper conductor layers 432, 438 can be formed using damascene processes in BEOL processing. In damascene processes, the copper is not patterned and etched (as the aluminum lower level conductors were). Instead, a metal inlay procedure known as a "damascene" process is used. The insulator layers 452, 454 are patterned to form trenches. Copper seed layer material is sputtered or otherwise deposited. An electroplating process is performed to fill the trenches and to ensure complete filling of the trenches, the electroplating continues above the surface of the trench. After the electroplating is finished with an "overburden" layer formed above the surface of the trenches, chemical mechanical processing or "CMP" is performed to complete the copper conductor layer and to planarize the upper surface of the layer. In CMP, a chemically active slurry is applied to a polishing pad. The slurry includes abrasive particles. The surface of the semiconductor wafer with the excess electroplated material is applied to the pad in a circular or other motion, and the excess copper material is polished away, leaving a planar trench filled with the planarized copper conductor. Additional insulator layers are formed and vias such as 435 and 436 can be formed between the conductor layers using etch and etch stopping layers of dielectric material. The upper level vias and the overlying trenches can be filled using the electroplating process. In this manner several layers of upper level conductors can be formed.

In the scribe seal 422, the uppermost conductor layer 432 is vertically connected to the layer 438 by a trench via 436. This trench via is formed on the side of the scribe seal 422 closest to the integrated circuit die and continues the vertical wall that is formed interrupting the insulation layers 450, 452, 454. In FIG. 4 an etch stop layer 452 is shown. However, this is but one example arrangement and the insulator layers 454, 450 and 452 can be formed of similar materials or of different materials as described above.

The scribe seal 422 of FIG. 4 also includes a passivation layer 456 that overlies the upper surface of the uppermost conductor layer 432 and can be formed of silicon oxide, silicon nitride, silicon oxynitride and other dielectric materials. In FIG. 4, the uppermost layer 457 of the passivation layer 456 is silicon nitride. The remainder of the passivation layer 459 can be silicon dioxide. The passivation layer 456 forms a protective layer, electrically insulating the conductors and also provides a physical coating to protect the metal conductors and the semiconductor substrate from corrosive elements and moisture. To form bond pads contacting the upper level conductor layer in the integrated circuit dies, openings are formed in the passivation layer 456 by pattern and etch processes.

In an example semiconductor process, the lower level conductor layers 446 are fairly thin, such as about one micron thick or less. However, the upper level copper conductor layers and the upper level copper via layers are each fairly thick, about three microns each, for a total of nine microns of vertical thickness. In a conventional scribe seal area, each of the conductor layers including the upper level conductor layers 432, 438 and vias 436 will be present to form a complete vertical barrier.

Figure 5A:
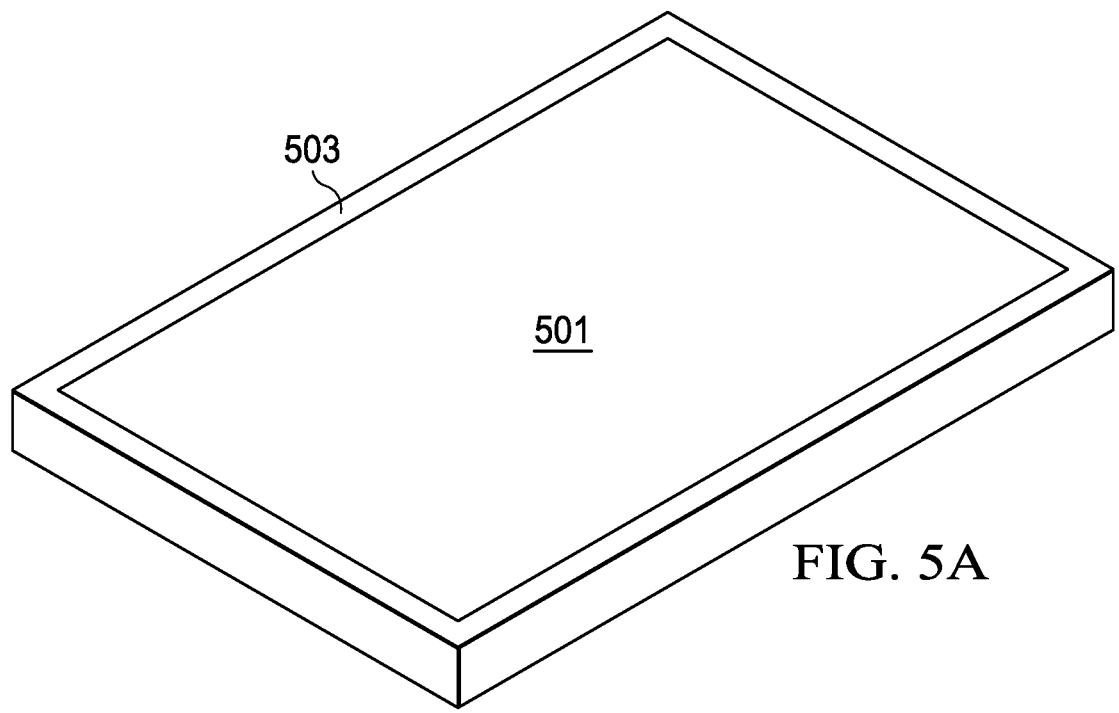
FIG. 5A illustrates an integrated circuit die including a scribe seal area in a projection.
Figure 5B:
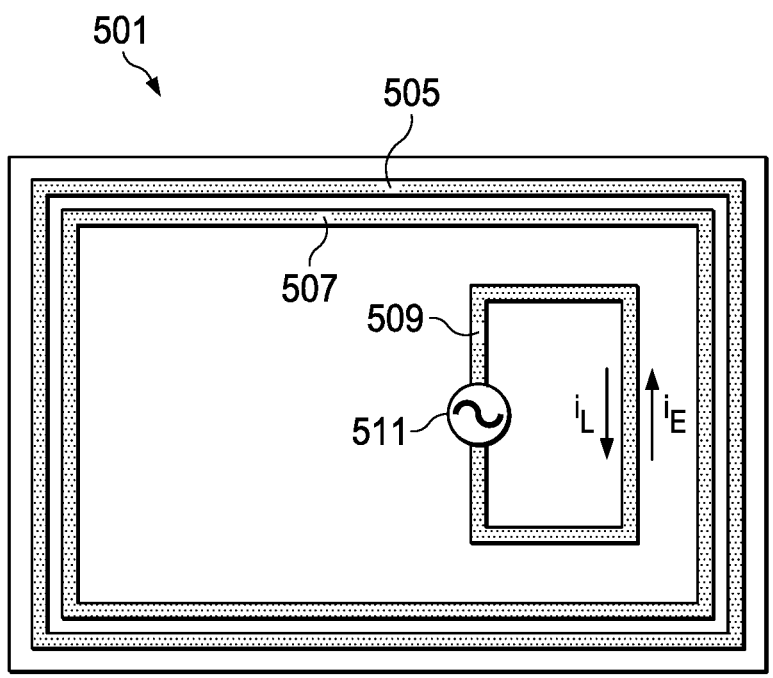
FIG. 5B illustrates the integrated circuit die and the scribe seal area in a plan view.

FIGS. 5A and 5B illustrate in a projection view and a plan view, respectively, a portion of an integrated circuit die 501 incorporating a scribe seal embodiment.

In FIG. 5A, silicon die 501 is shown with a scribe seal area 503. In a typical example, multiple scribe seals that form rings around the periphery of the integrated circuit can be used in area 503. Silicon is but one example material for the substrate and other semiconductor substrate materials including gallium arsenide, germanium, silicon germanium, indium phosphide, sapphire and other semiconductor substrates can be used. Epitaxial layers can form the semiconductor substrate or a portion of the substrate.

FIG. 5B shows a plan or top view of the semiconductor die 501. Two scribe seals 505, 507 are shown, with scribe seal 505 at the exterior periphery and scribe seal 507 is formed adjacent and inside the scribe seal 505. Each scribe seal forms a continuous loop around the periphery of the die 501. The scribe seal width will vary with the particular semiconductor process but can be about 20 ums, for example. The spacing between the scribe seals can also vary but can be a similar spacing distance. The scribe seals form a wall or barrier extending from the passivation layer at the upper portion of the integrated circuit structure to the semiconductor substrate and include each conductor layer, and each via layer, extending through each of the insulator layers.

Also shown on integrated circuit die 501 is a circuit with an inductive coil or loop antenna 509. This circuit includes an excitation source or voltage supply 511 that puts current into the coil 509. A desired inductor current $i_L$ appears flowing in coil 509. Because the scribe seals 505, 507 also form coils surrounding the coil 509, a corresponding eddy current labeled $i_E$ also flows in the opposite direction to $i_L$. This eddy or induced current occurs due to magnetic coupling between the coils, and is not desired in the circuit but occurs because the scribe seals 505, 507 form coils surrounding the coil 509 and are magnetically coupled to it. Current $i_E$ reduces efficiency of die-to-die coupling when two dies use a pair of coils to communicate, for example. Current $i_E$ is an induced current flowing in the scribe seal and has no function in the circuit, and is therefore represents a loss of energy with respect to the source 511. The induced current flowing in scribe seals 505, 507 reduces the efficiency of circuits within die 501, and reduces the efficiency of die-to-die coupling or die-to-die communications.

Figure 6:
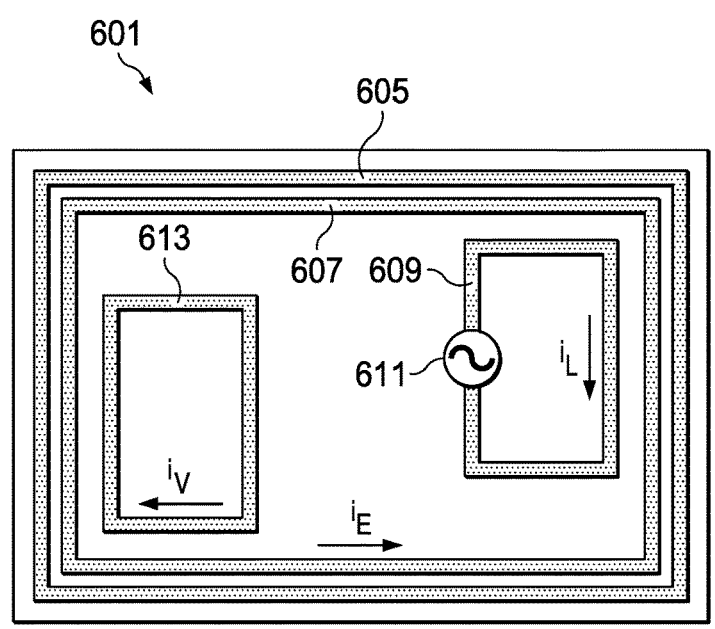
FIG. 6 depicts in a plan view an integrated circuit die with a first scribe seal and a second scribe seal and additional circuitry.

FIG. 6 shows in a plan view an integrated circuit die 601 including a first scribe seal 605 at the exterior periphery and a second scribe seal 607 formed spaced from scribe seal 605 and forming a loop within scribe seal 605. A first coil 609 is coupled to a supply or excitation source 611 and a current $i_L$ flows in coil 609. A second coil 613 is shown in another portion of the integrated circuit die 601.

When the current $i_L$ is flowing in coil 609, an induced or eddy current $i_E$ flows in the scribe seals, which form coils that are coupled to the coil 609. The coil 609 can be considered an "aggressor" circuit because it is actively causing current $i_L$ to flow. The coil 613 is a "victim" circuit and has an induced current $i_v$ flowing in it. This current $i_v$ is caused by coupling to the scribe seals and by the eddy current $i_E$ flowing in the scribe seals and is unintended and unwanted current. Because the scribe seals form coils surrounding the aggressor coil 609, and current $i_E$ flows in response to current $i_L$, the victim coil 613 also has unwanted current flowing in it.

Figure 7:
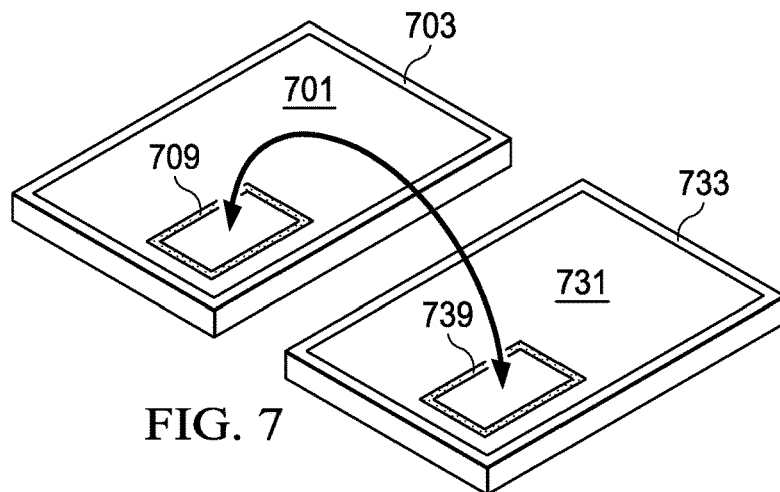
FIG. 7 depicts in a pair of integrated circuit dies having scribe seals.

FIG. 7 illustrates an application where die-to-die communication is performed using coils as transmitter and receiver antennas. In FIG. 7, reference labels used for the elements are similar to those used for similar elements in FIG. 6, for clarity. For example, integrated circuit die 601 corresponds to integrated circuit die 701. Integrated circuit die 701 is formed with coil 709 and scribe seal area 703, which can include multiple scribe seals. Similarly, integrated circuit die 731 is formed and physically separated from integrated circuit 701 to provide electrical isolation. Integrated circuit die 731 includes coil 739 that can act as an antenna or magnetic coupling element. Integrated circuit die 731 includes scribe seal area 733 that can include multiple scribe seals, or can be a single scribe seal.

In communication applications, signals are transmitted and received using the coils 739 and 709. In experiments, it was observed that die-to-die communication was not efficient when scribe seals 703, 733 are arranged as shown in FIG. 7. The eddy or induced current flowing in the scribe seals in the devices interfered with the communication efficiency.

Figure 8:
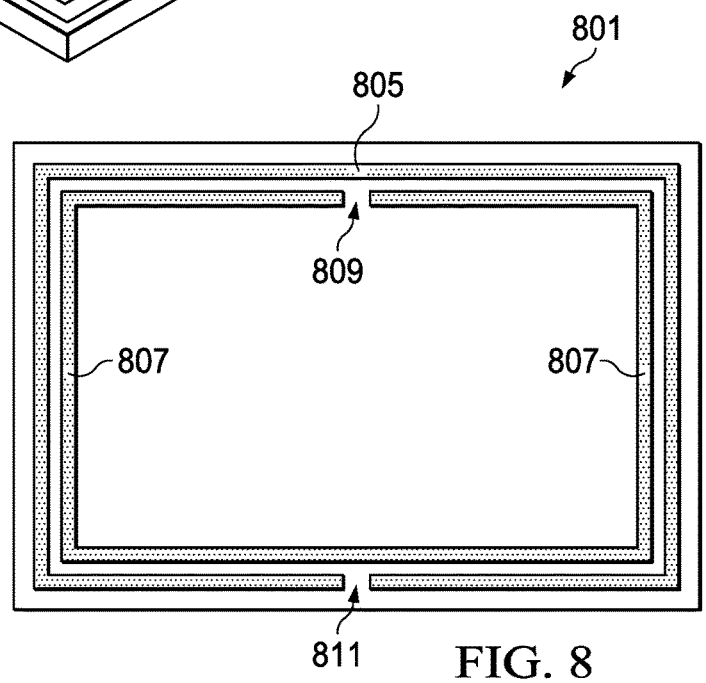
FIG. 8 depicts in a plan view an integrated circuit die including scribe seals of an embodiment.

FIG. 8 illustrates in a plan view an integrated circuit die 801 incorporating an embodiment. Reference labels used in FIG. 8 are similar to those used in FIG. 6 for similar elements, for clarity. For example, integrated circuit die 801 corresponds to integrated circuit die 601 in FIG. 6. In FIG. 8, scribe seal 805 and scribe seal 807 are arranged at the periphery of integrated circuit die 801 and are spaced apart. Scribe seal 805 is an almost continuous loop of conductive layers at the outer periphery and forms a coil, and has an opening 811. Opening 811 cuts through all of the conductive layers in the scribe seal 805. Similarly, scribe seal 807, which lies within scribe seal 805 forms a loop and has an opening 809. Opening 809 extends through each of the conductor layers in scribe seal 807.

The openings 809, 811 in the scribe seals reduce or prevent eddy current or induced current from flowing in the scribe seals 805, 807. By reducing the induced current, the efficiency of the coils used in the integrated circuit dies is increased. In an experiment where the coil is an antenna, use of the scribe seals with openings as shown in FIG. 8 resulted in a substantial increase in coupling efficiency between two integrated circuit dies in a multiple chip module. In an example, the openings were approximately 10 microns wide. The opening width should be great enough to prevent or reduce induced current from flowing in the scribe seals, while being small enough to make it less likely ions or contaminants will cross the opening. In an example, the openings were about 10 microns. In additional examples, openings between 10-20 microns can be used. Depending on the semiconductor process, other opening widths can also be used.

The openings in the scribe seals in FIG. 8 are arranged at opposite sides of the die 801 so that any migrating ion or contaminant would be unlikely to traverse both scribe seal openings and move into the interior of the integrated circuit die. Various other embodiment arrangements can be formed that interrupt the flow of induced current in the scribe seals, while preventing ions or contaminants from reaching the interior of the integrated circuit die.

Figure 9:
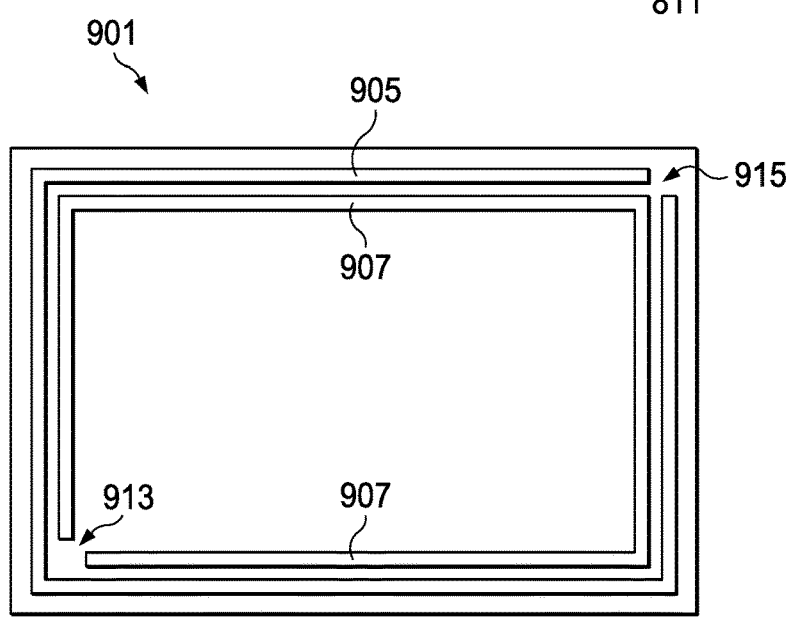
FIG. 9 depicts in a plan view an integrated circuit die having scribe seals of another embodiment.

FIG. 9 illustrates in a plan view an alternative embodiment including the scribe seals with openings. Reference labels used in FIG. 9 are similar to those used in FIG. 8 for similar elements, for clarity. For example, integrated circuit die 601 corresponds to integrated circuit die 801. In the embodiment shown in FIG. 9, openings are formed in the corner regions of the scribe seals.

In FIG. 9, integrated circuit die 901 includes an outer scribe seal 905 with an opening in one corner 915. A second scribe seal 907 that is formed spaced apart from and within scribe seal 905 has a second opening 913.

In FIG. 9, the openings 915, 913 extend through each conductor layer and through the conductive via layers of the respective scribe seals 905, 907, and prevent or reduce the induced currents from flowing in the scribe seals. The openings in FIG. 9 are arranged away from each other and are at opposing corners of integrated circuit die 901. The positions of the openings are arranged to prevent an ion from migrating into the interior of the integrated circuit die 901 by placing the openings far away from one other.

Figure 10:
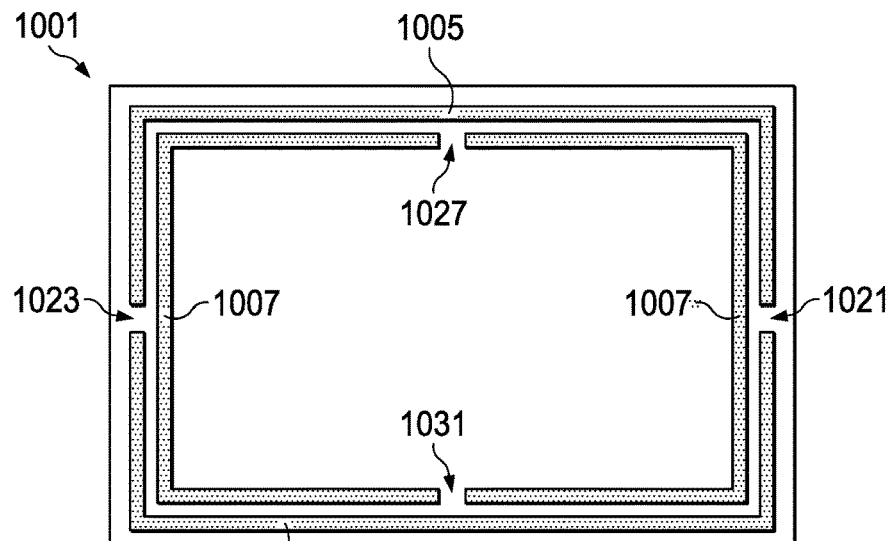
FIG. 10 depicts in a plan view an integrated circuit die having scribe seals of an additional embodiment.

FIG. 10 illustrates in a plan view an integrated circuit die 1001 incorporating another alternative embodiment. Similar reference labels are used in FIG. 10 for elements that are similar to the elements in FIG. 8, for clarity. For example, integrated circuit die 1001 corresponds to integrated circuit die 801 in FIG. 8. In FIG. 10, the integrated circuit die 1001 has scribe seals 1005 and 1007, with 1005 at or near the exterior periphery of the integrated circuit die 1001 and scribe seal 1007 formed spaced apart from the scribe seal 1005 and lying within it. In FIG. 10 each of the scribe seals 1005, 1007 has two openings. For example, scribe seal 1005 has openings 1021, 1023 formed on opposing sides of integrated circuit die 1001 and positioned away from one another. Scribe seal 1007 has openings 1027, 1031 formed on opposing sides and away from one another and positioned away from the openings in scribe seal 1005.

Figure 11:
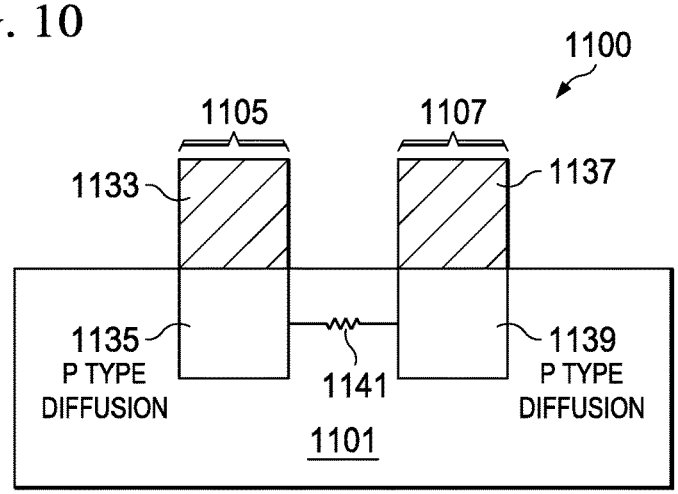
FIG. 11 depicts in a cross-sectional view a portion of an integrated circuit die including a scribe seal embodiment.

FIG. 11 illustrates in a cross sectional view a portion of the pair of scribe seals such as shown in FIGS. 8-10. Similar reference labels are used in FIG. 11 for elements that are similar to the elements in FIG. 8, for clarity. For example, the integrated circuit die 1101 corresponds to integrated circuit die 801 in FIG. 8. In FIG. 11, an integrated circuit die 1101 is shown with a scribe seal 1105 and 1107 positioned spaced from one another and in close proximity at or near the periphery of the integrated circuit 1101. A contact level metal forms the bottom part of the scribe seal structure above the substrate, and this is shown as metal 1133 for scribe seal 1105, and metal 1137 for scribe seal 1107. The scribe seals each include an active area in the substrate 1101, in this example a p diffusion region is formed for each scribe seal, shown as 1135 for scribe seal 1105, and 1139 for scribe seal 1107.

In operation, the diffusion areas 1135, 1139 are spaced from one another by the substrate material for integrated circuit die 1101, and this material has an intrinsic resistance 1141. Current can flow between the diffusion regions, through the substrate, and the current will flow through the intrinsic resistance 1141.

While use of the embodiment scribe seals shown in FIGS. 8-11 does greatly reduce induced currents flowing in the scribe seal, in experiments some induced current flows through the substrate such as 1101 and to continue flowing in the scribe seals even when the openings are formed.

Figure 12:
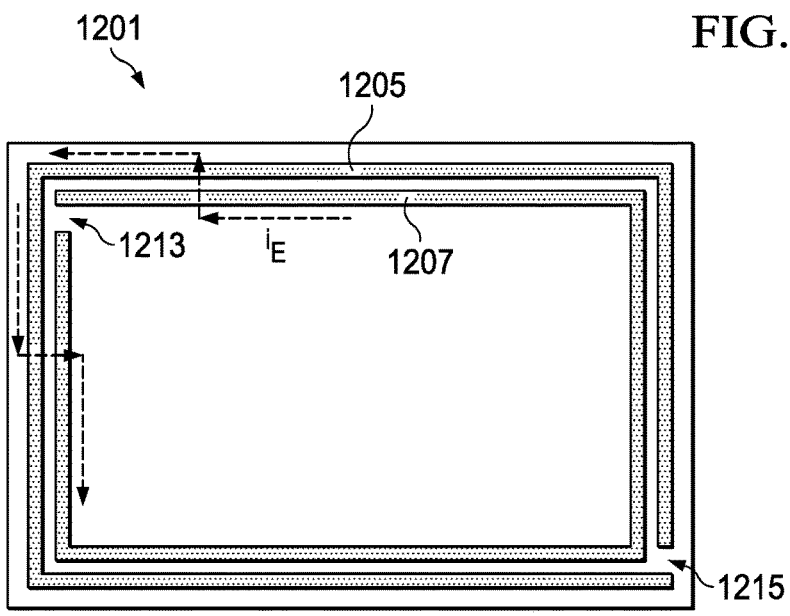
FIG. 12 depicts in a plan view an integrated circuit die including scribe seals of an embodiment in an operation.

FIG. 12 illustrates an example of induced current flow. The elements in FIG. 12 have reference labels similar to those for similar elements in FIG. 9, for clarity. For example, integrated circuit die 1201 corresponds to integrated circuit die 901. In FIG. 12, a plan view of an integrated circuit die 1201 includes scribe seals 1205, 1207 arranged similarly to those in FIG. 9, with openings 1215 and 1213 positioned in the corners. In FIG. 12, there is an induced or eddy current $i_E$ flowing. Induced current $i_E$ flows through the substrate 1201 near the opening at 1213 and makes its way back to scribe seal 1207, crossing the opening. The substrate 1201 has intrinsic resistance so that the induced current is substantially reduced over a prior known continuous scribe seal, however induced current still can flow. In additional alternative embodiments, the scribe seals include structures in the substrate in the area where the scribe seal metal contacts the substrate to further reduce or eliminate induced currents from flowing.

Figure 13:
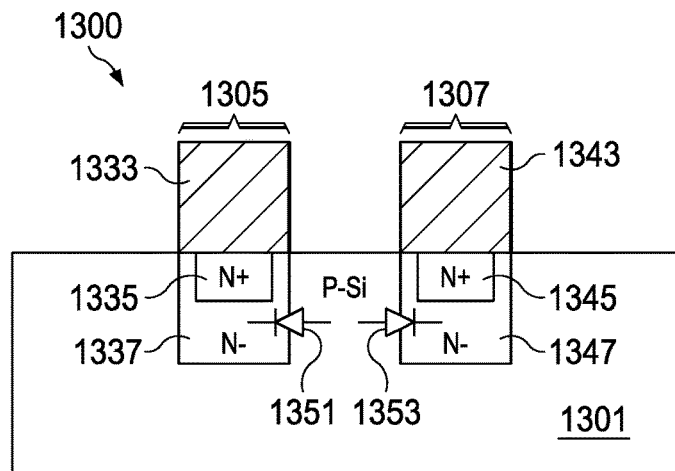
FIG. 13 depicts in a cross sectional view a portion of an integrated circuit die including an alternative scribe seal embodiment.

FIG. 13 illustrates in a cross sectional view an alternative embodiment that has additional structures in the semiconductor substrate. The reference labels for the elements in FIG. 13 are similar to those in the previous figures for similar elements, for clarity. For example, the integrated circuit die 1301 corresponds to integrated circuit die 601 in FIG. 6.

In FIG. 13, the active areas beneath the scribe seals are altered with respect to the scribe seals shown in FIG. 11. In FIG. 13, the scribe seals 1305, 1307 are shown in close proximity, and spaced apart. The metal layer contacting the substrate forms a metal contact 1333 for scribe seal 1305 and a metal contact 1343 for scribe seal 1307. The substrate 1301 is shown as a p-type silicon substrate, although other substrate types can also be used. In FIG. 13, an N+ region is formed within a N type diffusion in the scribe seal area, and the metal contact 1333 for scribe seal 1305 makes contact to the N+ region 1335, which lies within N diffusion 1337. Similarly, the N+ region 1345 is formed within the N type diffusion region 1347 in the scribe seal area for scribe seal 1307. Metal contact 1343 contacts the N+ and N type regions 1345, 1347.

In operation, the p silicon substrate has a boundary with the N− regions that form intrinsic and reverse biased diodes at the p-n junctions for both N− region 1337, which corresponds to scribe seal 1305, and N− region 1347, which corresponds to scribe seal 1307. The intrinsic diode for scribe seal 1305 is labeled 1351, and the intrinsic diode for scribe seal 1307 is labeled 1353. These diodes are formed due to the p-n junctions between the N− diffusions and the P-type silicon substrate.

The intrinsic diodes 1351 and 1353 are reverse biased with respect to the scribe seals. Accordingly induced or eddy current is prevented or greatly reduced from flowing in the substrate and between the scribe seals when the embodiment in FIG. 13 is used.

Figure 14:
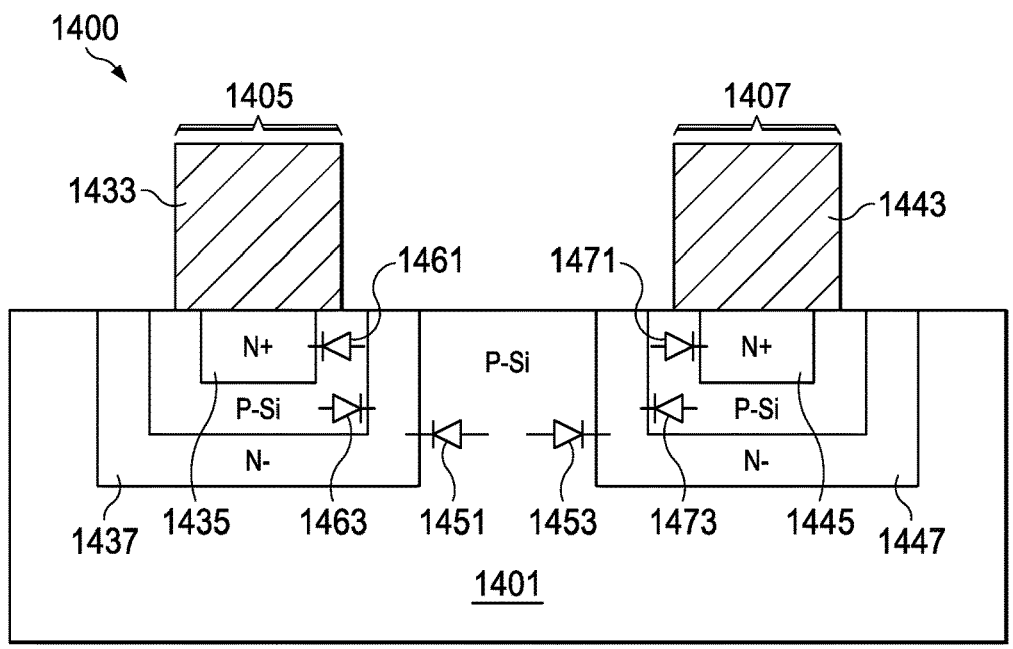
FIG. 14 depicts in a cross sectional view a portion of an integrated circuit die including another alternative scribe seal embodiment.

However, it is still possible for some current to flow in the substrate from the scribe seals when the embodiment of FIG. 13 is used. FIG. 14 illustrates another embodiment that provides additional structures to prevent or reduce induced current from flowing in the substrate.

In FIG. 14, the elements have reference labels that are similar to the reference labels used for similar elements in FIG. 13, for clarity. For example, scribe seal 1405 in FIG. 14 corresponds to scribe seal 1305 in FIG. 13.

FIG. 14 illustrates in a cross sectional view an alternative embodiment for scribe seals. Scribe seals 1405 and 1407 are spaced one from another at a periphery area for integrated circuit die 1401. Metal contacts 1433 for scribe seal 1405 and 1443 for scribe seal 1407 overlie the semiconductor substrate. In FIG. 14, an N+ region 1435 is formed for scribe seal 1405, while another N+ region 1445 is formed for scribe seal 1407. The integrated circuit die 1401 is formed from p-type silicon substrate material. The scribe seals 1405 and 1407 include an N-type tank 1437 and 1447 surrounding a P type region around the N+ diffusion regions 1435, 1445.

Intrinsic diodes are formed at the p-n junctions formed in the scribe seals 1405, 1407. For example, diode 1461 is formed between the p type material surrounding the N+ diffusion region 1435, and the N+ diffusion region. A second intrinsic diode 1463 forms between the P-type material surrounding N+ diffusion region and the N− tank 1437. A third intrinsic diode 1451 for scribe seal 1405 forms between the P-type silicon substrate 1401 and the N− tank 1437.

Similarly the scribe seal 1407 has intrinsic diodes 1471 between N-type region 1445 and the surrounding P-type silicon material, diode 1473 between the N− tank 1447 and the P-type silicon material surrounding N+ region 1445, and diode 1453 between the P-type silicon substrate 1401 and N-tank 1447.

In operation, induced or eddy current is prevented or reduced by the six intrinsic diodes that are formed in the scribe seals 1405 and 1407. Diode 1461 is reverse biased from the N+ diffusion region 1435, and the P-silicon material surrounding the N+ diffusion 1435. Similar intrinsic diode 1451 is reverse biased from the N− tank 1437 and the P-type silicon 1401. Current flowing from scribe seal 1407 towards scribe seal 1405 is blocked by the reverse biased diode 1463 between the N-tank 1437 and the P-silicon material surrounding N+ diffusion 1435.

Induced current is prevented or greatly reduced in the embodiment scribe seals of FIG. 14 because the induced current is blocked by reverse biased diodes from flowing in either direction, from the scribe seals into the substrate material, and also from the substrate material into the scribe seals.

Figure 15:
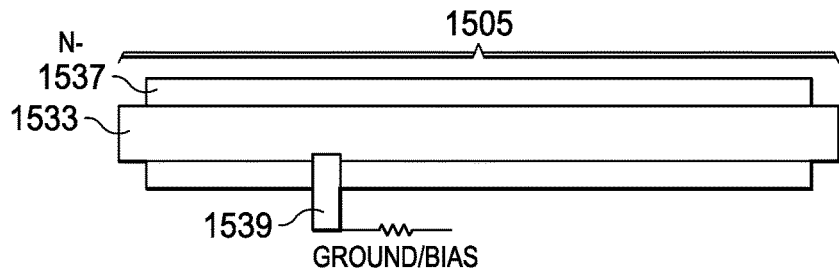
FIG. 15 depicts in a plan view a portion of a scribe seal of an embodiment.

FIG. 15 illustrates in a plan view an additional aspect of an embodiment. In FIG. 15, the elements have reference labels that are similar to the reference labels used for similar elements in FIG. 14, for clarity. For example, scribe seal 1505 in FIG. 15 corresponds to scribe seal 1405 in FIG. 14.

In FIG. 15, a portion of a scribe seal 1505 is shown in a plan view. The contact metal portion 1533 is shown overlying the N− region 1537. A ground strap 1539 is shown. By periodically grounding the metal 1533, the induced current can be further reduced or eliminated. Alternatively, the strap 1539 can be tied to a different bias level. Use of the bias straps can be incorporated with the structures in FIG. 14, for example, to form an additional embodiment and further improve performance.

Figure 16:
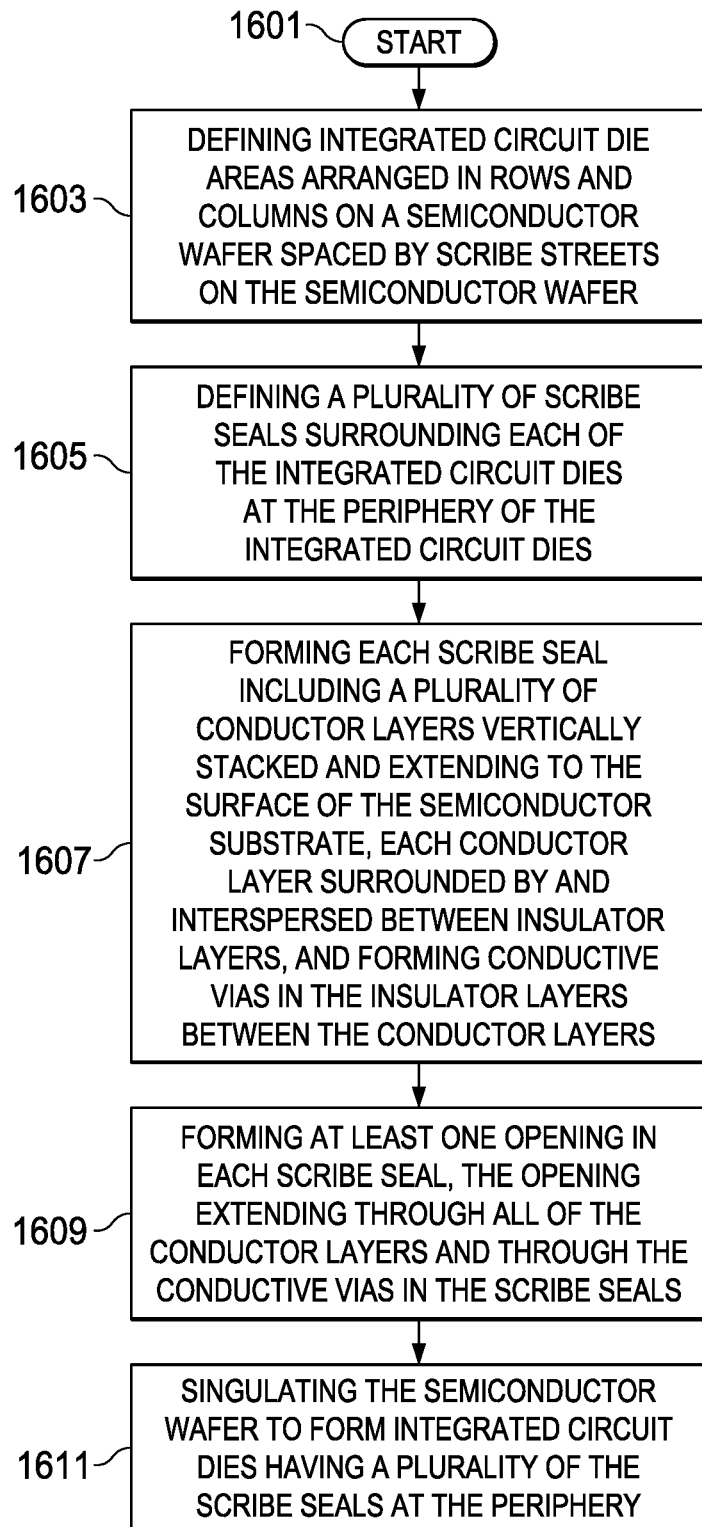
FIG. 16 illustrates in a flow diagram a method embodiment.

FIG. 16 illustrates in a flow diagram a method embodiment. The method begins at step 1601, Start. The method then proceeds to step 1603, where the integrated circuit die areas are arranged on the semiconductor wafer in rows and columns and separated by scribe streets for sawing or singulation.

The method of FIG. 16 then proceeds to step 1605. In step 1605, scribe seals are defined surrounding each integrated circuit die at the periphery of the integrated circuit die.

In step 1607 the scribe seals are formed along with other structures in the integrated circuit die, the scribe seals including conductor layers vertically stacked and extending to the surface of the semiconductor substrate, each of the conductor layers surrounded by insulator material and including conductive vias in the insulator layers between the conductive layers. The scribe seals form vertical barriers including each conductor layer and each via layer used in the integrated circuit die.

At step 1609, openings are formed in the scribe seal for each of the conductor layers and for each of the via layers. The openings in the scribe seals will be formed contemporaneously with the formation of each of the conductive layers, and each opening will be filled with insulator material as the insulator layers and conductor layers are completed.

At step 1611, after the integrated circuit dies are completed, the semiconductor wafer is singulated to form the individual integrated circuit dies. Each individual integrated circuit die has the scribe seals at or near the periphery of the integrated circuit die and including the openings.

While the example described above illustrate two scribe seals at the periphery of the integrated circuit dies, in additional alternative embodiments, three or more scribe seals can be used. Openings in each of the scribe seals can reduce or eliminate induced currents. The additional scribe seals can also include the intrinsic diodes of FIGS. 13 and 14 to further reduce induced current from flowing in the substrate.

Example embodiments and arrangements include an integrated circuit die, including lower level conductor layers overlying a semiconductor substrate, lower level insulator layers between the lower level conductor layers and surrounding the lower level conductor layers, lower level vias extending vertically through the lower level insulator layers and electrically coupling ones of the lower level conductors, upper level conductor layers overlying the lower level conductor layers, upper level insulator layers between and surrounding the upper level conductor layers, upper level vias extending vertically through the upper level insulator layers and coupling the upper level conductor layers. The integrated circuit die includes at least two scribe seals positioned at a periphery of the integrated circuit die and spaced from one another, the at least two scribe seals including the upper level conductor layers, the upper level vias, the lower level conductor layers and the lower level vias to form a vertical barrier extending vertically from the semiconductor substrate to a passivation layer at an upper surface of the integrated circuit die; and at least one opening extending vertically through the respective one of the at least two scribe seals and extending through: the upper level conductor layers, the upper level via layers, the lower level conductor layers, and the lower level via layers.

In a further example, the integrated circuit die includes the at least two scribe seals that further include a second opening spaced from the at least one opening. In still another example, in the integrated circuit die, the at least one opening of the at least two scribe seals is in a corner of the integrated circuit die.

In yet another example, in the integrated circuit die described above the at least two scribe seals have an opening positioned in a central portion of one side of the integrated circuit die, and the at least one opening for a first of the at least two scribe seals is on an opposite side from the at least one opening of a second of the at least two scribe seals. In alternative example, in the integrated circuit die described above, the at least two scribe seals further include: a first doped diffusion region in the semiconductor substrate having a first concentration of a first conductivity type; and a second doped diffusion region in the semiconductor substrate having a second concentration of the first conductivity type and surrounding the first doped diffusion region; and the semiconductor substrate is of a second conductivity type different from the first conductivity type. In a further example, in the integrated circuit die described above, the at least two scribe seals further include at least one lower level conductor having a strap portion coupled to receive a bias voltage.

In an additional example, an apparatus includes integrated circuit dies on a semiconductor substrate and spaced from one another, and having scribe seals formed at a periphery of respective ones of the integrated circuit dies, the scribe seals further including: lower level conductor layers overlying the semiconductor substrate; lower level insulator layers between the lower level conductor layers and surrounding the lower level conductor layers; lower level vias extending vertically through the lower level insulator layers and electrically coupling the lower level conductors; upper level conductor layers overlying the lower level conductor layers; upper level insulator layers between and surrounding the upper level conductor layers; upper level vias extending vertically through the upper level insulator layers and coupling the upper level conductor layers; and at least one opening extending vertically through each of the scribe seals and cutting through each of: the upper level conductor layers, the upper level via layers, the lower level conductor layers, and the lower level via layers.

In another example arrangement, in the apparatus described above, the scribe seals form a vertical barrier of metal around the periphery of the integrated circuit dies, and extend from the surface of the semiconductor substrate to a passivation layer. In still a further example, in the apparatus described above, at least one opening in the scribe seals is located in a corner portion of the integrated circuit dies. In still an additional example, in the apparatus described above, the scribe seals include at least a first scribe seal and a second concentric scribe seal. In still a further example arrangement, in the apparatus described above, the scribe seals include at least a first scribe seal with a first opening and a second scribe seal with a second opening positioned at a point opposite the first opening. In an additional arrangement, in the above described apparatus, at least one opening in the scribe seals is located in a central portion of one side of the integrated circuit dies. In still another arrangement, in the above described apparatus, the at least one opening in the scribe seals is located in a corner portion of the integrated circuit dies. In a further arrangement, in the above described apparatus, the scribe seals each include at least two openings, the two openings positioned on opposite sides of the integrated circuit dies.

In an additional example arrangement, in the apparatus describe above, the scribe seals includes a first scribe seal and a second scribe seal positioned spaced from and surrounded by the first scribe seal, and the at least two openings in the first scribe seal are spaced apart from the at least two openings in the second scribe seal.

In yet another example arrangement, The scribe seals further include a first doped diffusion region in the semiconductor substrate having a first concentration of a first conductivity type; and a second doped diffusion region in the semiconductor substrate having a second concentration of the first conductivity type and surrounding the first doped diffusion region; wherein the semiconductor substrate is of a second conductivity type different from the first conductivity type.

In still a further arrangement, in the apparatus described above, the scribe seals in the scribe seals further include: a first doped diffusion region in the semiconductor substrate having a first concentration of a first conductivity type; and a first region of the semiconductor substrate surrounding the first doped diffusion region in the semiconductor substrate and having a second conductivity type different from the first conductivity type; and a second doped diffusion region in the semiconductor substrate surrounding the first region of the semiconductor substrate and having a second concentration of the first conductivity type; and the semiconductor substrate is of the second conductivity type. In yet another example arrangement, in the above described apparatus, the first conductivity type is N type, and the second conductivity type is P type.

An example method arrangement includes: defining integrated circuit areas on a semiconductor substrate; defining scribe seal areas at a periphery of the integrated circuit areas; forming at least two scribe seals spaced from one another and surrounding a periphery of the integrated circuit areas; including: forming lower level conductor layers spaced apart by lower level insulator layers, forming lower level vias extending through the lower level insulator layers between the lower level conductors, forming upper level conductor layers overlying the lower level conductor layers, the upper level conductor layers spaced apart by upper level insulator layers, forming upper level vias extending through upper level insulator layers between the upper level conductors and electrically connecting the upper level conductor layers to one another and to the lower level conductors; the scribe seals forming a vertical barrier that extends from a passivation layer overlying the scribe seal area and through upper level conductor layers, the upper level via layers, the lower level conductor layers and the lower level via layer, and contacts the semiconductor substrate; and forming at least one vertical opening in the scribe seals that extends through each of the upper level conductor layers, the upper level via layers, the lower level conductor layers, and the lower level via layers.

In a further example, in the above described method, forming at least one vertical opening in the scribe seals further includes positioning the at least one vertical opening in the at least two scribe seals apart from one another.

Modifications are possible in the described embodiments, and other embodiments are possible within the scope of the claims.

What is claimed is:
1. An integrated circuit die having opposing first and second sides, the integrated circuit die comprising:
   a passivation layer at the first surface;
   a semiconductor substrate at the second surface, the substrate having a first conductivity type;
   a first scribe seal at an exterior periphery of the die;
   a second scribe seal concentric with and interior to the first scribe seal;
   a conductive coil spaced from and interior to the second scribe seal, the conductive coil coupled to a voltage supply terminal configured to supply current through the coil;
   a voltage controlled oscillator (VCO), the VCO including the conductive coil;
   the first and second scribe seals extending from the semiconductor substrate to an upper level passivation layer;
   the first and second scribe seals including respective lower level conductor layers, lower level vias, upper level conductor layers and upper level vias, the lower level conductor layers overlying the semiconductor substrate, and the upper level conductor layers overlying the lower level conductor layers;
   lower level insulator layers between and surrounding the lower level conductor layers, the lower level vias extending through ones of the lower level insulator layers and coupling ones of the lower level conductor layers;
   a ground strap coupled between at least one of the lower level conductor layers and a ground terminal;
   upper level insulator layers between and surrounding the upper level conductor layers, the upper level vias extending through ones of the upper level insulator layers and electrically coupling ones of the upper level conductor layers;
   the first scribe seal having a first opening along the first side of the integrated circuit die, the first opening extending through the first scribe seal's upper level conductor layers, upper level via layers, lower level conductor layers and lower level via layers;
   the second scribe seal having a second opening along the second side of the integrated circuit die, and the second opening being opposite the first opening and extending through the second scribe seal's upper level conductor layers, upper level via layers, lower level conductor layers and lower level via layers;
   a first doped diffusion region in the semiconductor substrate, the first doped diffusion region having a first concentration of a second conductivity type different from the first conductivity type;
   a second doped diffusion region in the semiconductor substrate, the second doped diffusion region surrounding the first doped diffusion region and having a second concentration of the second conductivity type, the second concentration being less than the first concentration; and
   the first scribe seal includes a lower level via that contacts the first doped diffusion region.

2. The integrated circuit die of claim 1, wherein the coil is a first coil, and is inductively coupled to a second coil.

3. The integrated circuit die of claim 2, wherein the first coil is configured to transmit or receive electromagnetic communication signals from the second coil.

4. The integrated circuit die of claim 1, wherein the first coil is adapted to be coupled to a capacitor, resulting in an oscillator circuit.

5. The integrated circuit die of claim 1, wherein the first conductivity type is P type, and the second conductivity type is N type.

6. The integrated circuit die of claim 1, wherein the first conductivity type is N type, and the second conductivity type is P type.

* * * * *